United States Patent
Choi et al.

(10) Patent No.: US 7,741,664 B2
(45) Date of Patent: Jun. 22, 2010

(54) COMPLEMENTARY METAL OXIDE SEMICONDUCTOR IMAGE SENSOR AND METHOD FOR FABRICATING THE SAME

(75) Inventors: Yang-Kyu Choi, Daejeon (KR); Kuk-Hwan Kim, Daejeon (KR)

(73) Assignee: Korea Advanced Institute of Science & Technology, Yuseong-Gu (KR)

( * ) Notice: Subject to any disclaimer, the term of this patent is extended or adjusted under 35 U.S.C. 154(b) by 8 days.

(21) Appl. No.: 11/567,513

(22) Filed: Dec. 6, 2006

(65) Prior Publication Data

US 2007/0152248 A1   Jul. 5, 2007

(30) Foreign Application Priority Data

Jan. 5, 2006   (KR) ............... 10-2006-0001335

(51) Int. Cl.
    *H01L 27/146* (2006.01)
(52) U.S. Cl. .............. 257/291; 257/E27.133; 977/762; 977/814; 977/954
(58) Field of Classification Search ............. 977/721, 977/762, 814, 952–954; 257/291, E27.13, 257/E27.133
    See application file for complete search history.

(56) References Cited

U.S. PATENT DOCUMENTS

| 6,518,115 | B2* | 2/2003 | Lee et al. .......... 438/231 |
| 2004/0253759 | A1* | 12/2004 | Garber et al. .......... 438/46 |
| 2005/0265648 | A1* | 12/2005 | Roitman et al. .......... 385/12 |
| 2007/0105356 | A1* | 5/2007 | Wu et al. .......... 438/584 |

FOREIGN PATENT DOCUMENTS

JP   7-235658 A   9/1995

* cited by examiner

*Primary Examiner*—Minh-Loan T Tran
*Assistant Examiner*—W. Wendy Kuo
(74) *Attorney, Agent, or Firm*—Foley & Lardner LLP

(57) ABSTRACT

Provided are a CMOS image sensor and a method for fabricating the same. A nanopillar is plurally formed at an upper end of a light receiving element.

17 Claims, 8 Drawing Sheets

(a)

(b)

(c)

(a)

(b)

(c)

_US 7,741,664 B2_

COMPLEMENTARY METAL OXIDE SEMICONDUCTOR IMAGE SENSOR AND METHOD FOR FABRICATING THE SAME

This Nonprovisional application claims priority under 35 U.S.C. §119(a) on Patent Application No. 10-2006-0001335 filed in Korea on Jan. 5, 2006, the entire contents of which are hereby incorporated by reference.

BACKGROUND

1. Field

The present invention relates to a complementary metal oxide semiconductor (CMOS) image sensor, and more particularly, to a CMOS image sensor having a great photosensitivity and a method for fabricating the same.

2. Description of the Background Art

A charge-coupled device (CCD) image sensor has been much used owing to its simple circuit and its good performance about a picture quality and a noise. However, because a mobile equipment needs a low power and a high integration, attention is being paid to a complementary metal oxide semiconductor (CMOS) image sensor satisfying the low power and the high integration.

The CMOS image sensor refers to a semiconductor device for converting an optical image into an electric signal. The CMOS image sensor comprises a light detecting part for detecting light, and a logic circuit part for data processing the detected light into the electric signal. The CMOS image sensor employs a switching method in which a MOS transistor is provided as much as the number of pixels using a CMOS technology, and an output is sequentially detected using the MOS transistor.

The CMOS image sensor is fabricated using a conventional CMOS transistor process. The CMOS image sensor has an advantage of less power consumption, low price, and high integration. Accordingly, by an intensive research for some years past, the CMOS image sensor is being expected to be an alternative of the CCD image sensor in many applications.

However, despite having the lower power and the high integration, the CMOS image sensor has a disadvantage that it has a smaller photosensitivity than the conventional CCD image sensor due to a dark current. Thus, many researches are in progress to solve the disadvantage.

The conventional CMOS image sensor will be described below.

FIG. 1 is a plan view illustrating the conventional CMOS image sensor. FIG. 2 is a cross-sectional view taken along line 2-2' of FIG. 1.

Only a light receiving region for receiving light, and a transistor region for processing the received light into an electric signal will be illustrated and described below.

In the conventional CMOS image sensor, light receiving elements 106 and 108 such as a photodiode (PD) are formed in the light receiving region on a silicon substrate 101 having P-impurity regions 102 formed at both sides. A floating diffusion 104 is formed in parallel at one side of the light receiving elements 106 and 108 in the transistor region. A transfer gate 103 is positioned on the floating diffusion 104. A shallow trench isolation 105 is formed along an edge of the silicon substrate 101 to isolate the above devices from other devices.

The CMOS image sensor comprises a reset transistor (Rx), a driving transistor (Dx), and a selection transistor (Sx) connecting with the floating diffusion 104.

A non-described reference numeral 107 denotes an oxide film.

As shown in FIG. 2, in the conventional CMOS image sensor, the light receiving elements 106 and 108 are formed by a large area to effectively receive a large amount of light. The light receiving elements 106 and 108 are of a structure where a $P^+$ impurity region 106 doped with P-type impurities is layered on an N impurity region 108 doped with N-type impurities, and are of a type where they are exposed as light receiving surfaces.

The light receiving surfaces of the light receiving elements 106 and 108 are of a flat structure where they are formed of crystalline silicon. Due to the flat structure, the conventional light receiving elements 106 and 108 have a limitation of a light receiving capability as follows.

First, in light receiving portions of the light receiving elements 106 and 108, the crystalline silicon has a small absorption coefficient for visible rays. In general, a wavelength of light absorbed by material is greatly dependent on a bandgap of the material. The crystalline silicon used for the light receiving portions of the light receiving elements 106 and 108 has an indirect bandgap of 1.12 eV and thus, absorbs only light having a short wavelength of 1.1 µm or less. However, the absorption coefficient of the crystalline silicon for the visible rays of the wavelength of 1.1 µm or less cannot sufficiently generate carriers transferred to the floating diffusion 104. Thus, in the crystalline silicon of the light receiving portion, its absorption coefficient is too small to sufficiently form the carriers.

Second, there is a loss of light not absorbed but reflected from the crystalline silicon that is the light receiving portion. Some of the light incident on the light receiving elements 106 and 108 induce light generation and form the carriers flowing to the floating diffusion 104, but other is reflected and lost without re-absorption. It is known in the art that an amount of the reflected and lost light is greater than an amount of the light inducing the light generation.

Third, a light receiving area of the CMOS image sensor does not exceed an area of the CMOS image sensor. In the conventional CMOS image sensor, the light receiving elements 106 and 108 are parts of the CMOS image sensor. Thus, the area of the light receiving elements 106 and 108 does not exceed the area of the CMOS image sensor. Since a cell size of the CMOS image sensor should reduce for high integration, a reduction of the area of the light receiving elements 106 and 108 gradually degrades the light receiving capability of the CMOS image sensor.

SUMMARY

Accordingly, the present invention is to provide a CMOS image sensor of a new structure, for increasing a photosensitivity even in case where the CMOS image sensor is high integrated.

Also, the present invention is to provide a method for fabricating a CMOS image sensor having a high photosensitivity.

In one aspect, there is provided a CMOS (complementary metal oxide semiconductor) image sensor having a light receiving element, wherein a nanopillar is plurally formed at an upper end of the light receiving element.

Implementations may include one or more of the following features. For example, the nanopillar may be of crystalline silicon.

The nanopillar has a diameter of nanometer or less.

In another aspect, there is provided a method for fabricating a CMOS image sensor, the method comprising inducing a plasma discharge and forming nanodusts in a light receiving region; etching the light receiving region using the nanodusts as a mask; and removing the nanodusts.

Implementations may include one or more of the following features. For example, the inducing of the plasma discharge may comprise a step of injecting the plasma gas into the light receiving region.

In the inducing of the plasma discharge, the nanodusts may be formed by a combination of the plasma gas and the light receiving element at the time of inducing the plasma discharge.

The light receiving element may be silicon.

The plasma gas may be a halogen-based compound and oxygen ($O_2$).

The nanodusts may have sizes of nanometer or less.

In another aspect, there is provided a method for fabricating a CMOS image sensor. The method comprises arranging nanometer sized particles in a light receiving region; etching the light receiving region using the particles as a mask; and removing the particles.

Implementations may include one or more of the following features. For example, the particles may be formed of polymer component.

A diameter of a nanopillar formed by the etching may be dependent on a diameter of the particle.

A nanopillar formed by the etching may have a diameter of nanometer or less.

The particle may be a sphere ball.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

Figure 1:
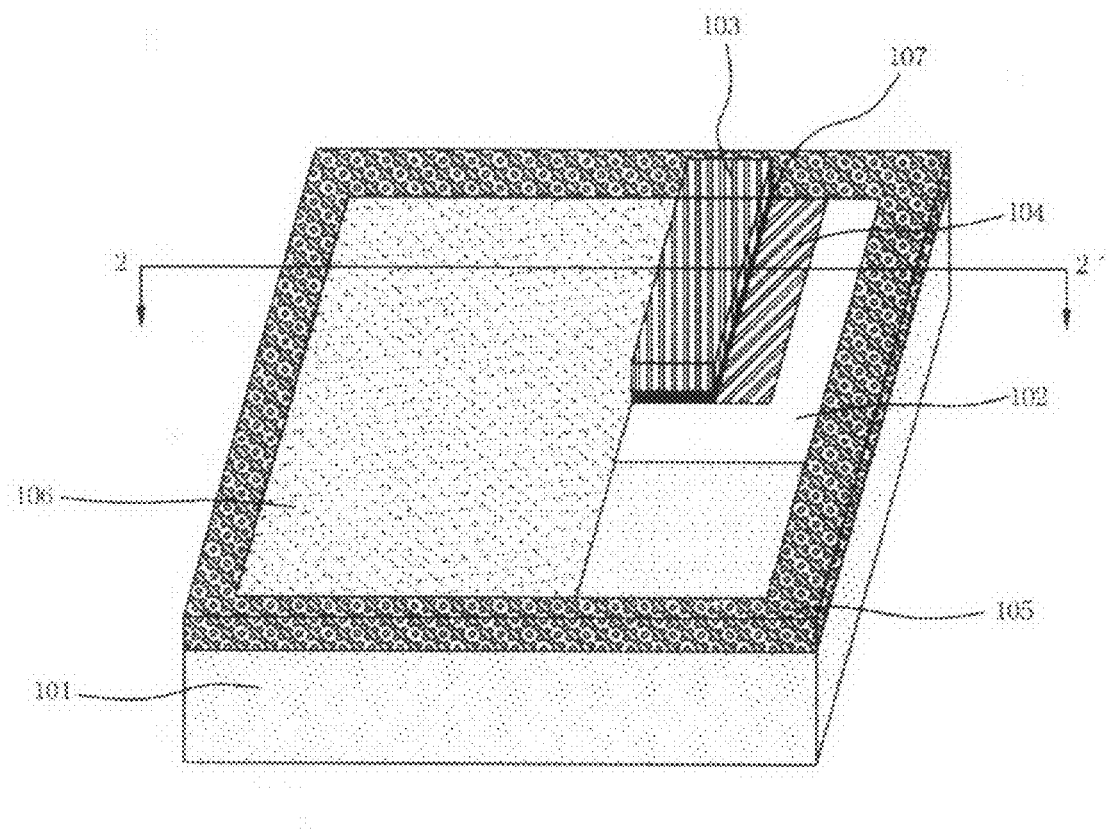
FIG. 1 is a plan view illustrating a conventional CMOS image sensor.
Figure 2:
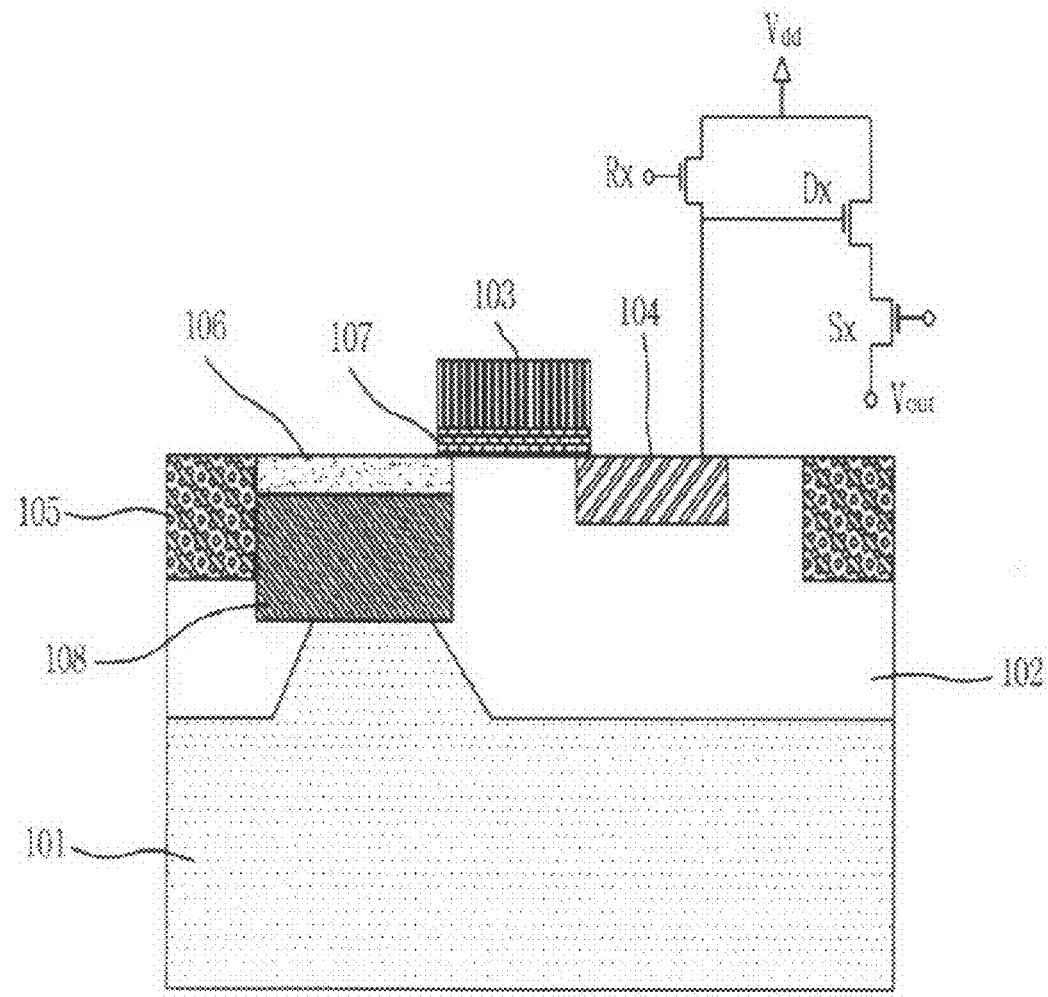
FIG. 2 is a cross-sectional view taken along line 2-2' of FIG. 1.
Figure 3:
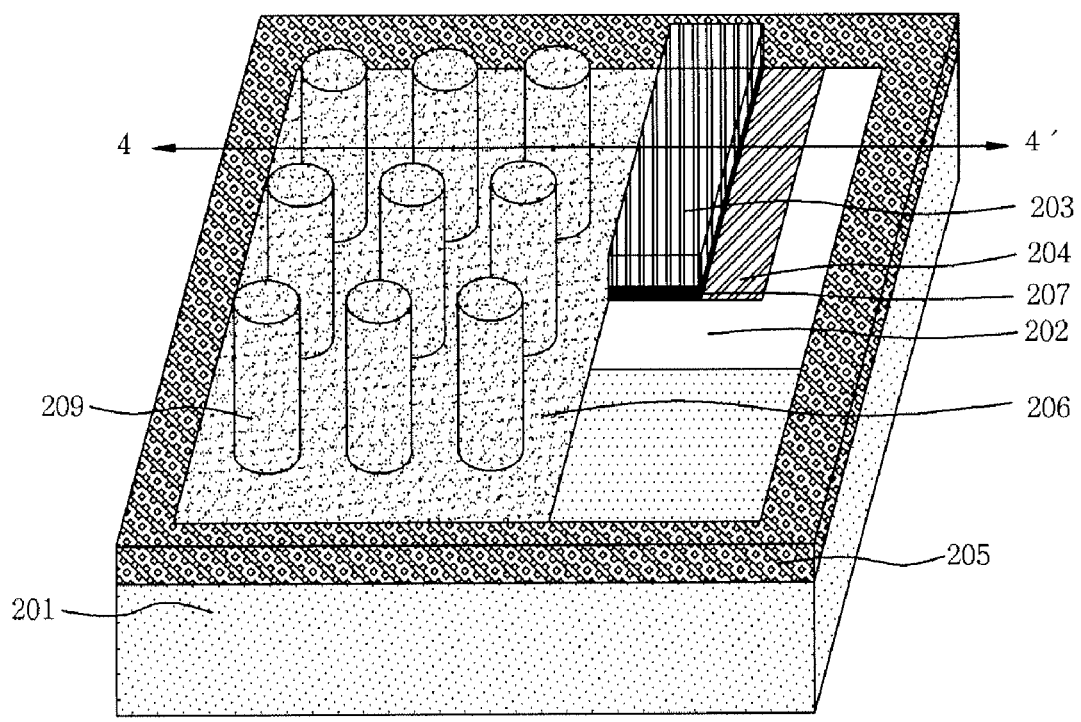
FIG. 3 is a plan view illustrating a CMOS image sensor according to the present invention.
Figure 4:
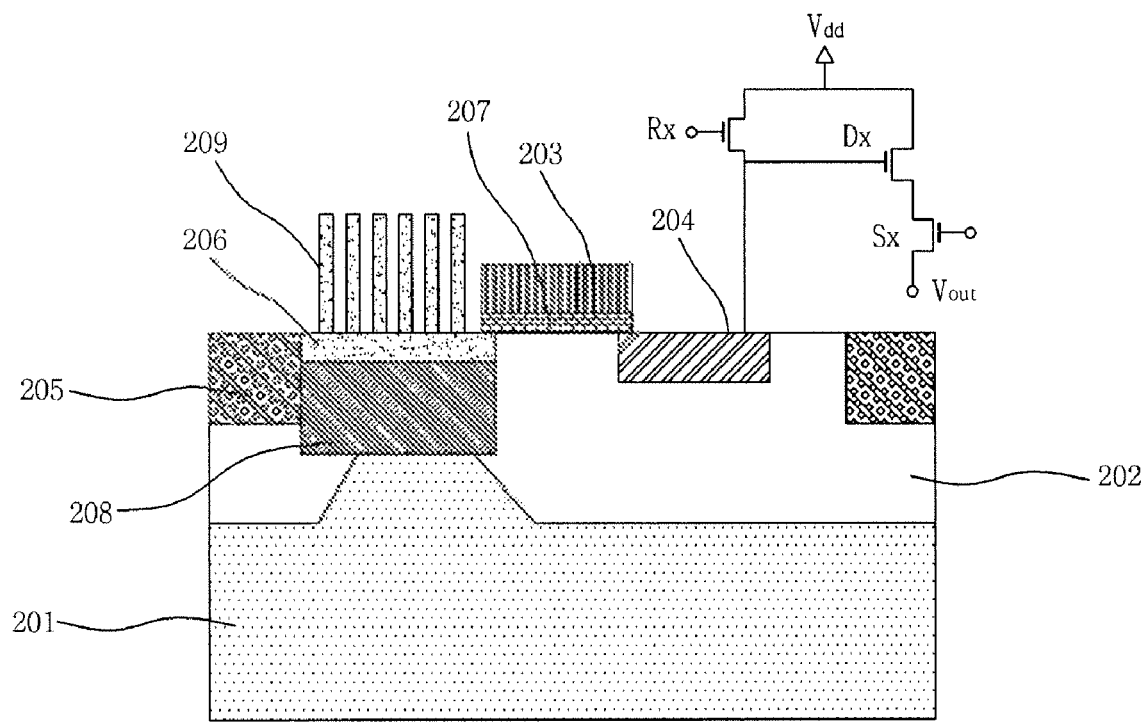
FIG. 4 is a cross-sectional view taken along line 4-4' of FIG. 3.

FIG. 3 is a plan view illustrating a complementary metal oxide semiconductor (CMOS) image sensor according to the present invention. FIG. 4 is a cross-sectional view taken along line 4-4' of FIG. 3.

For reference, only a light receiving region and a transistor region will be illustrated and described below.

According to the present invention, the CMOS image sensor comprises a semiconductor substrate 201; light receiving elements 206 and 208 of the light receiving region; a floating diffusion 204 formed in parallel with the light receiving elements 206 and 208; a transfer gate 203 positioned at an upper side between the light receiving elements 206 and 208 and the floating diffusion 204; and the transistor region for data-processing a detected light from the light receiving region into an electric signal.

As shown in FIG. 4, the transistor region comprises a reset transistor (Rx), a driving transistor (Dx), and a selection transistor (Sx) connecting with the floating diffusion 204.

The reset transistor (Rx) discharges electric charges stored in the floating diffusion 204, thereby performing a reset. The driving transistor (Dx) serves as a source follower buffer amplifier. The selection transistor (Sx) serves to perform switching and addressing.

The semiconductor substrate 201 is formed of silicon. The semiconductor substrate 201 has a P-impurity region 202 where P-type impurities are doped at both sides.

A shallow trench isolation (STI) 205 is formed along an edge of the semiconductor substrate 201 so as to isolate devices formed on the semiconductor substrate 201 from other devices.

The light receiving elements 206 and 208, photodiodes positioned in the light receiving region, serve to receive the light. As shown in FIG. 3, the light receiving elements 206 and 208 are formed by a large area to effectively receive a large amount of light. The light receiving elements 206 and 208 are of a structure where a $P^+$ impurity region 206 doped with P-type impurities is layered on an N impurity region 208 doped with N-type impurities, and nanopillars 209 are formed at a predetermined distance on the $P^+$ impurity region 206.

Like a surface of the light receiving element, the nanopillars 209 are formed of crystalline silicon. The nanopillars 209 have a size of nanometer or less, and are of a structure in which the light receiving area is extended up to a three-dimensional space. A method for forming the nanopillars 209 will be described later.

The transfer gate 203 is positioned between the light receiving elements 206 and 208 and the floating diffusion 204. An oxide film 207 underlies the transfer gate 203 so that optical charges collected in the light receiving elements 206 and 208 can be transferred to the floating diffusion 204.

The newly structured CMOS image sensor according to the present invention has several characteristics for increasing a light receiving capability in comparison to a conventional CMOS image sensor.

First, the nanopillars 209 of crystalline silicon can be numerously formed on the surfaces of the light receiving elements 206 and 208, thereby greatly increasing an absorption coefficient for visible rays having a wavelength of 1.1 μm or less. In other words, the light receiving elements 206 and 208 according to the present invention can effectively react with a short wavelength of light owing to small volumes of the nanopillars 209 existing on the surfaces of the light receiving elements 206 and 208. Therefore, the light receiving elements 206 and 208 have a greater absorption coefficient for the light having the wavelength of 1.1 μm or less, and have a greater photosensitivity than conventional light receiving elements 106 and 108.

Second, the nanopillars 209 of crystalline silicon are numerously formed on the surfaces of the light receiving elements 206 and 208, thereby extending the light receiving area up to the three-dimensional space by overcoming a limitation in which the light receiving area of the conventional light receiving element is limited to a two-dimensional plane. Thus, the present invention can overcome a drawback that, when a cell size of the CMOS image sensor reduces, the light receiving area reduces and the photosensitivity reduces, and can secure the light receiving area wider than the cell area of the CMOS image sensor.

Third, the nanopillars 209 of crystalline silicon are numerously formed on the surfaces of the light receiving elements 206 and 208, thereby advantageously re-absorbing the light reflected from and lost in the conventional light receiving elements 106 and 108.

Fourth, the nanopillars 209 protrude from the surfaces of the light receiving elements 206 and 208. Thus, the light receiving elements 206 and 208 can react with the lights incident in several directions.

Methods for forming the nanopillars in the light receiving element at the time of fabricating the CMOS image sensor having the great photosensitivity according to the present invention will be described with reference to FIGS. 5 to 8 below.

First Embodiment

Figure 5:
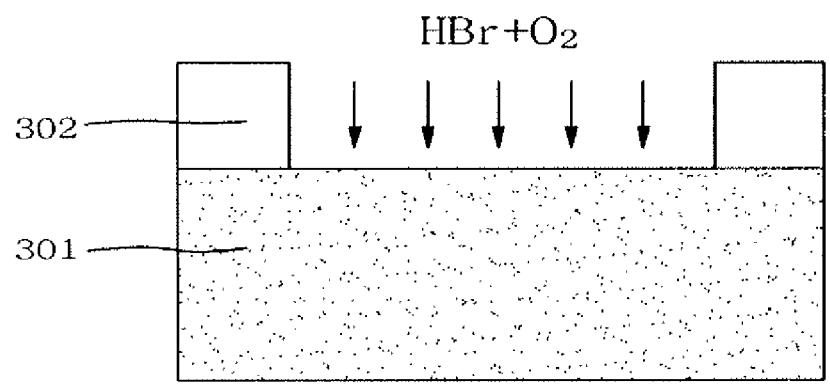
FIG. 5 is a sequential diagram illustrating a method for fabricating a CMOS image sensor according to an exemplary embodiment of the present invention.
Figure 5:
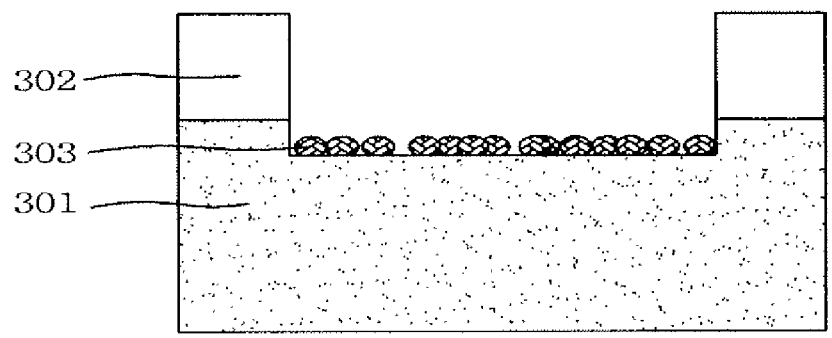
Figure 5:
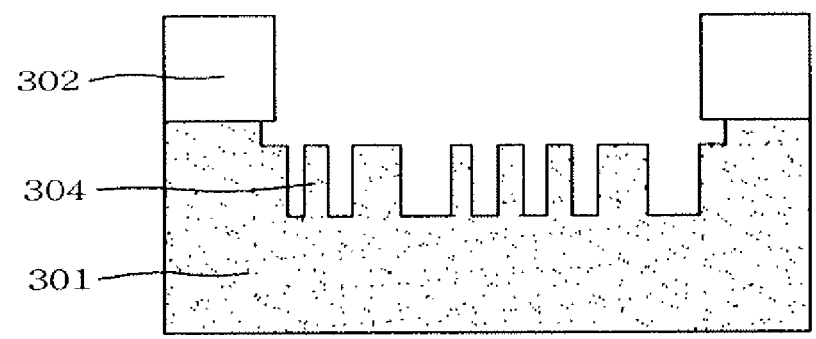

FIG. 5 is a sequential diagram illustrating a method for fabricating a CMOS image sensor according to an exemplary embodiment of the present invention. In FIG. 5, (a) is a diagram illustrating a process of injecting a plasma gas into a light receiving region, (b) is a diagram illustrating nanodusts formed after the injection of the plasma gas, (c) is a diagram illustrating a process of forming nanopillars after a plasma discharge.

Figure 6:
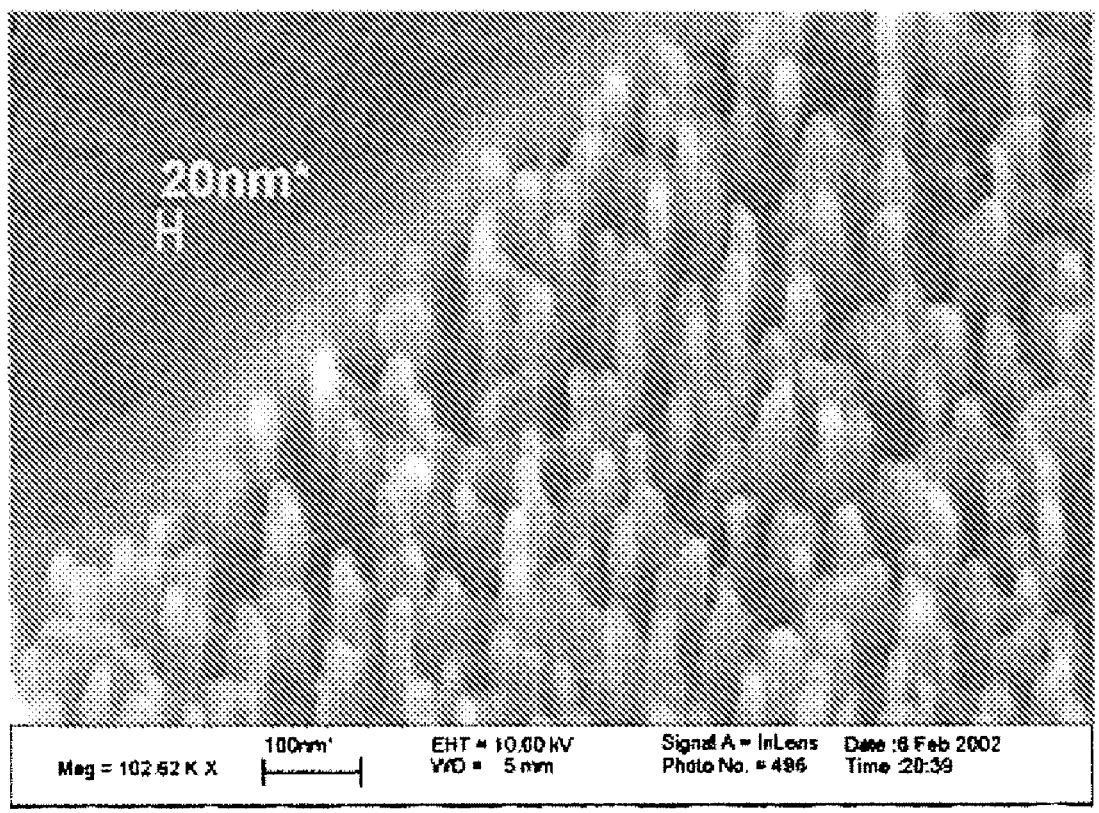
FIG. 6 is a photograph taken by a scanning electron microscopy (SEM), for illustrating a CMOS image sensor fabricated by the method of FIG. 5.

FIG. 6 is a photograph taken by a scanning electron microscopy (SEM), for illustrating the CMOS image sensor fabricated by the method of FIG. 5.

The method for fabricating the CMOS image sensor according to the first exemplary embodiment of the present invention employs a plasma discharge and etching process, not a conventional photolithography process, to form the nanopillars. It is a method for making polymer components generated in plasma etching into the nanodusts, and using the nanodusts as a mask for forming the nanopillars.

As first shown in (a) of FIG. 5, a photoresist 302 is formed on a silicon substrate 301 as a light receiving element. After that, the plasma gas for the plasma discharge is injected into a nanopillar forming region on the basis of the photoresist 302. The plasma gas is a mixture of a halogen-based compound and oxygen ($O_2$). The halogen-based compound mainly employs HBr or $Cl_2$.

Referring next to (b) of FIG. 5, when plasma is generated in the light receiving region after the proper injection of the plasma gas, the silicon substrate 301 is etched to a predetermined depth while being combined with the plasma gas, thereby forming the nanodusts 303 having nano sizes. When the HBr (or $Cl_2$) and the oxygen ($O_2$) are injected as the plasma gas, the etched silicon and a radical of the plasma gas are combined, thereby forming the nanodusts 303 such as $Si_xBr_yO_z$ (or $Si_xCl_yO_z$). The nanodusts 303 become by-products of a non-volatile component and thus, are not discharged outside an etch chamber and sit on the silicon substrate 301. Therefore, the nanodusts 303 serve as the mask for forming the nanopillar as described later.

As finally shown in (c) of FIG. 5, the etching is performed using the nanodusts 303 plurally formed in single or combination on the silicon substrate 301 as the mask, thereby forming the nanopillar. After that, the nanodusts 303 are removed.

The nanopillar 304 is formed at a portion of the etched silicon substrate 301 where the nanodusts 303 are formed. As shown in FIG. 6, the nanopillar 304 extended up to the three-dimensional space can have a diameter of nanometer or less.

The diameter of the nanopillar 304 can be controlled depending on a combination degree of the nanodusts 303.

Second Embodiment

Figure 7:
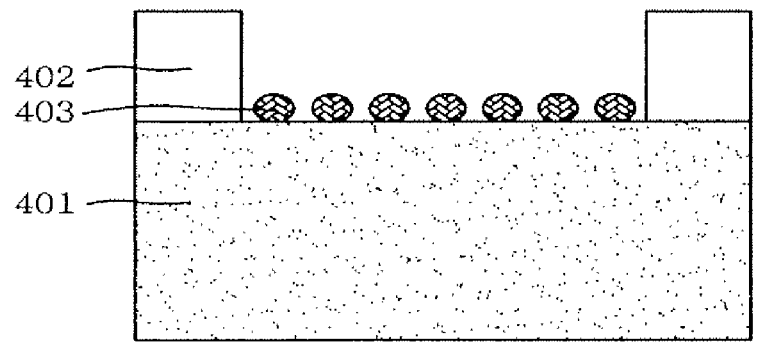
FIG. 7 is a sequential diagram illustrating a method for fabricating a CMOS image sensor according to another exemplary embodiment of the present invention.
Figure 7:
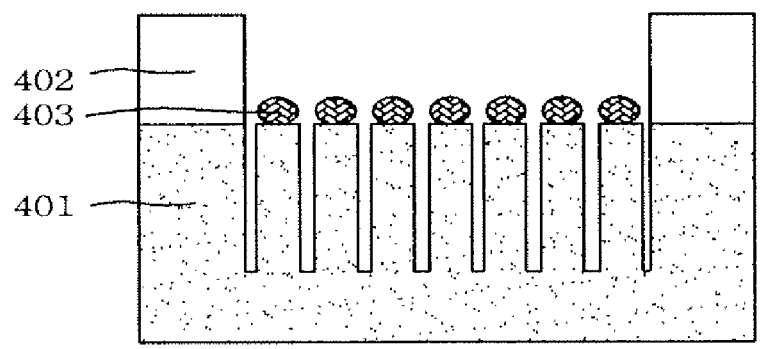
Figure 7:
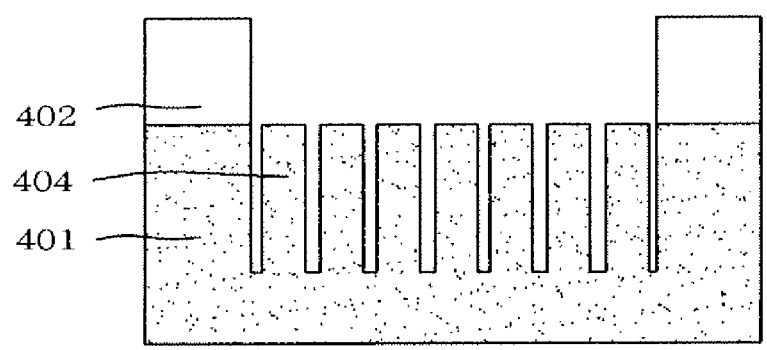

FIG. 7 is a sequential diagram illustrating a method for fabricating a CMOS image sensor according to another exemplary embodiment of the present invention. In FIG. 7, (a) is a diagram illustrating a process of forming a sphere ball in a light receiving region, (b) is a diagram illustrating an etching process using the sphere ball as a mask, (c) is a diagram illustrating a light receiving element after the etching process.

Figure 8:
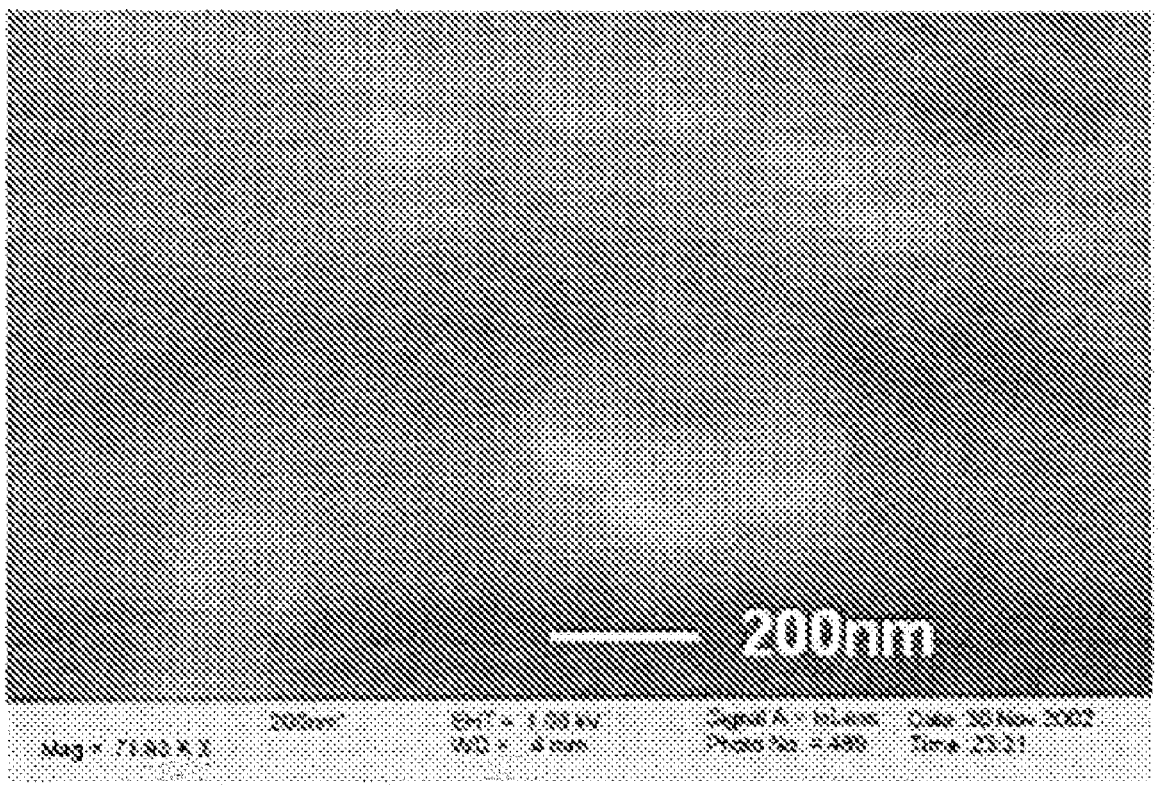
FIG. 8 is a photograph taken by a SEM, for illustrating a CMOS image sensor fabricated by the method of FIG. 7.

FIG. 8 is a photograph taken by a SEM, for illustrating the CMOS image sensor fabricated by the method of FIG. 7.

According to a second exemplary embodiment of the present invention, the method for fabricating the CMOS image sensor employs a nanosphere lithography method to form a nanopillar, and has an advantage of forming the nanopillar beyond a limitation of a resolution of a conventional photolithography method.

Referring first to (a) of FIG. 7, a photoresist 402 is formed on a silicon substrate 401, and the sphere balls 403 having sizes of nanometers are arranged as a single layer in a nanopillar forming region on the basis of the photoresist 402. The sphere ball 403 is formed of polymer-based component, and serves as the mask in the etching process described later. In the second exemplary embodiment of the present invention, the sphere ball 403 is used as the nanometer sized mask. Therefore, it is obvious that nanometer sized particles are all possible without limitation only to a sphere shape. The following description will be made on the basis of the sphere ball.

Referring next to (b) of FIG. 7, the etching process is performed using the sphere balls 403 arranged in an earlier step as an etching stop layer. Then, the nanopillar 404 is formed only under the sphere ball 403, and has a pattern having a uniform size and regularly arranged.

After the etching, the sphere ball 403 of the mask is removed, and the light receiving element having the nanopillar 404 shown in (c) of FIG. 7 is completed.

As shown in FIG. 8, the nanopillar 404 has a diameter of nanometer, and is formed in three dimensions and extends a light receiving area.

The diameter of the nanopillar 404 is dependent on a diameter of the nanometer sized sphere ball 403. Thus, the nanopillar 404 can be formed beyond a limitation of a resolution of a conventional photolithography method.

As described above, the CMOS image sensor according to the present invention has the greater absorption coefficient for the visible rays than in the conventional CMOS image sensor having the two-dimensional light receiving area, thereby increasing the photosensitivity.

The CMOS image sensor according to the present invention extends the light receiving area up to the three-dimension space using the nanopillar, thereby overcoming the limitation in which the light receiving area does not exceed the total cell size of the CMOS image sensor, and securing a greater light receiving area than the conventional two-dimensional light receiving area.

Having the nanopillar protruding up from the surface of the light receiving element, the CMOS image sensor according to the present invention can react with the light incident in several directions and also the light reflected from the surface of the conventional light receiving element. Thus, the present invention can contribute to a remarkable increase of the photosensitivity.

Further, the CMOS image sensor according to the present invention increases its resolution, achieves the high integration, the low voltage, and the low power, and promotes its more various uses for a mobile equipment to attract much attention in the future.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A CMOS (complementary metal oxide semiconductor) image sensor comprising:
    a semiconductor substrate;
    a light receiving element formed in the semiconductor substrate, wherein the light receiving element comprises a first-conductivity-type semiconductor layer and a second-conductivity-type semiconductor layer located over the first-conductivity-type semiconductor layer;
    a plurality of nanopillars located directly on and adjacent to the second-conductivity-type semiconductor layer of the light receiving region;
    a floating diffusion region formed in the semiconductor, in parallel with the light receiving element;
    a transfer gate positioned at an upper side between the light receiving element and the floating diffusion region; and
    a transistor region for data-processing a detected light from the light receiving region into an electric signal.

2. The CMOS image sensor of claim 1, wherein the plurality of nanopillars comprise crystalline silicon.

3. The CMOS image sensor of claim 1, wherein the nanopillar has a diameter of less than 100 nanometers.

4. The CMOS image sensor of claim 1, wherein the nanopillar has a diameter of less than 50 nanometers.

5. The CMOS image sensor of claim 1, wherein the nanopillar has a diameter of less than 30 nanometers.

6. The CMOS image sensor of claim 1, wherein the first-conductivity-type semiconductor layer comprises a N impurity region doped with N-type impurities, and the second-conductivity-type semiconductor layer comprises a $P^+$ impurity region doped with P-type impurities.

7. The CMOS image sensor of claim 1, wherein the transistor region comprises a reset transistor, a driving transistor and a selection transistor.

8. The CMOS image sensor of claim 1, wherein the CMOS image sensor further comprises an oxide film underlying the transfer gate.

9. A CMOS (complementary metal oxide semiconductor) image sensor comprising:
    a light receiving element;
    a plurality of nanopillars located over the light receiving element;
    wherein:
        the light receiving element comprises a first-conductivity-type semiconductor layer and a second-conductivity-type semiconductor layer located over the first-conductivity-type semiconductor layer, and
        the plurality of nanopillars are located directly on and adjacent to the second-conductivity-type semiconductor layer of the light receiving element.

10. The CMOS image sensor of claim 9, wherein the first-conductivity-type semiconductor layer comprises n-type silicon, and second-conductivity-type semiconductor layer comprises heavily doped p-type silicon.

11. The CMOS image sensor of claim 9, further comprising:
    a floating diffusion region; and
    a transfer gate located between the light receiving region and the floating diffusion region.

12. The CMOS image sensor of claim 11, wherein the CMOS image sensor further comprises an oxide film located underneath the transfer gate.

13. The CMOS image sensor of claim 9, wherein the plurality of nanopillars comprise crystalline silicon.

14. The CMOS image sensor of claim 9, wherein each of the plurality of nanopillars has a diameter of less than 100 nanometers.

15. The CMOS image sensor of claim 9, wherein each of the plurality of nanopillars has a diameter of less than 50 nanometers.

16. The CMOS image sensor of claim 9, wherein each of the plurality of nanopillars has a diameter of less than 30 nanometers.

17. The CMOS image sensor of claim 9, wherein a transistor region comprises a reset transistor, a driving transistor and a selection transistor.

* * * * *